United States Patent [19]

Mahalek et al.

[11] Patent Number: 4,695,915
[45] Date of Patent: Sep. 22, 1987

[54] SHORT CIRCUIT AND OVERLOAD PROTECTION CIRCUIT FOR OUTPUT STAGE TRANSISTORS

[75] Inventors: Josef Mahalek, Neufahrn; Egon Vetter, Hofheim, both of Fed. Rep. of Germany

[73] Assignee: Telefunken electronic GmbH, Heilbronn, Fed. Rep. of Germany

[21] Appl. No.: 710,513

[22] Filed: Mar. 11, 1985

[30] Foreign Application Priority Data

Mar. 13, 1984 [DE] Fed. Rep. of Germany ....... 3409058

[51] Int. Cl.$^4$ .......................... H02H 3/08; H02H 9/02
[52] U.S. Cl. ........................................ 361/56; 361/86; 361/91; 361/101
[58] Field of Search ............... 361/42, 56–58, 361/91, 93, 94, 98, 101, 86

[56] References Cited

U.S. PATENT DOCUMENTS

| | | | |
|---|---|---|---|
| 3,182,246 | 5/1965 | Lloyd | 361/88 X |
| 3,366,871 | 1/1968 | Conner | 361/91 X |
| 3,748,569 | 7/1973 | Frank et al. | 361/91 X |

FOREIGN PATENT DOCUMENTS

| | | |
|---|---|---|
| 2538453 | 1/1976 | Fed. Rep. of Germany . |
| 2415628 | 9/1976 | Fed. Rep. of Germany . |
| 3022267 | 6/1980 | Fed. Rep. of Germany . |
| 3104015 | 12/1982 | Fed. Rep. of Germany . |

OTHER PUBLICATIONS

Arthur R. Bailey, *Wireless World*, "Output Transistor Protection in A.F. Amplifiers," (1968), pp. 154–156.

*Primary Examiner*—A. D. Pellinen
*Assistant Examiner*—Todd E. DeBoer
*Attorney, Agent, or Firm*—Spencer & Frank

[57] ABSTRACT

The invention relates to a short circuit and overload protection circuit for output stage transistors based on the principle of power monitoring. The gist of the invention is that the collector emitter voltage of a power output stage transistor is detected by a limitation and threshold value network and a protective transistor whose collector drives the base of the driving transistor of the output stage and protects the latter from overload. The output stage transistor is driven in timed sequence or continuous operation. By a variation of the base current of the output stage transistor via a change in its base resistance, the response threshold of the protection device may be influenced within a large range.

18 Claims, 2 Drawing Figures

4,695,915

SHORT CIRCUIT AND OVERLOAD PROTECTION CIRCUIT FOR OUTPUT STAGE TRANSISTORS

BACKGROUND OF THE INVENTION

The invention relates to a short circuit and overload protection circuit for output stage transistors.

In order to prevent damage to, output stage transistors, they must not exceed a certain predetermined power dissipation in their operating range. When the load to be driven is short-circuited or when for some other reason (viewed as an equivalent circuit) the load assumes a low resistance, for example, through leakage currents, etc., the collector current of the output stage transistor increases in an inadmissible manner. This also involves an increase in its collector emitter voltage, which results in an inadmissible rise in its power dissipation and, consequently, damage to or destruction of the output stage transistor.

In order to limit the collector current of the output stage transistor to an admissible value, a resistor is normally connected in series with the switching path of the transistor and the consumer. The disadvantage of this arrangement is that in the event of a short circuit, the output stage transistor conducts current. Also, in many applications, the current limiting resistor causes an inadmissibly high voltage drop, with the result that electrical consumers no longer obtain the full operating voltage.

A protective circuit for the output stage transistor wherein the latter is switched off in the event of a short circuit and, therefore, does not heat up, is known from German Auslegeschrift No. 2 310 448. This protective circuitry does, however, require a relatively expensive Zener diode and a measuring resistor which is connected in series with the switching path and reduces the voltage for the consumer.

SUMMARY OF THE INVENTION

The object underlying the present invention is, therefore, to provide a short circuit and overload protection circuit for output stage transistors, wherein, in a very simple manner and without an additional voltage drop, power dissipation limitation is effected in a measuring resistor connected in series with the switching path.

This object is attained in accordance with the invention in that the emitter collector voltage of the output stage transistor to be protected is detected by a protective transistor via a limitation and threshold value network, and in that the collector of this protective transistor is connected to the base of the driving transistor of the output stage transistor.

In a suitable embodiment, the limitation and threshold value network consists of a resistor which is located between the emitter of the output stage transistor and the base of an npn switching transistor whose emitter is connected to the collector of the output stage transistor. Located between the collector of the npn switching transistor and the base of a pnp switching transistor connected downstream therefrom is a further resistor. The emitter of the pnp switching transistor is connected to the positive pole of the supply voltage source. The collector of the pnp switching transistor leads to one of the resistors of a voltage divider whose other resistor is connected to ground. Connected at the tap of the voltage divider is the base of the protective transistor whose emitter is connected to ground potential and whose collector is connected to the base of the driving transistor of the output stage transistor.

The principal advantage of the short circuit and overload protection circuit for output stage transistors according to the invention is that its power dissipation is directly detected via the collector emitter path of the output stage transistor, and that almost the entire operating supply voltage is present at the consumer when the output stage transistor is in the switched-through state. The circuit functions over a large voltage and temperature range for ohmic, inductive and capacitive loads. Furthermore, a power limitation for the output stage transistor is effected in a simple manner and without expensive components, and the necessary components may be integrated in an advantageous manner.

Further advantageous developments of the invention are indicated in the subclaims.

Embodiments of the invention are contained in the subclaims.

BRIEF DESCRIPTION OF THE DRAWINGS

The drawings show embodiments of the invention which will be described in greater detail hereinafter.

DESCRIPTION OF THE PREFERRED EMBODIMENTS

Figure 1:
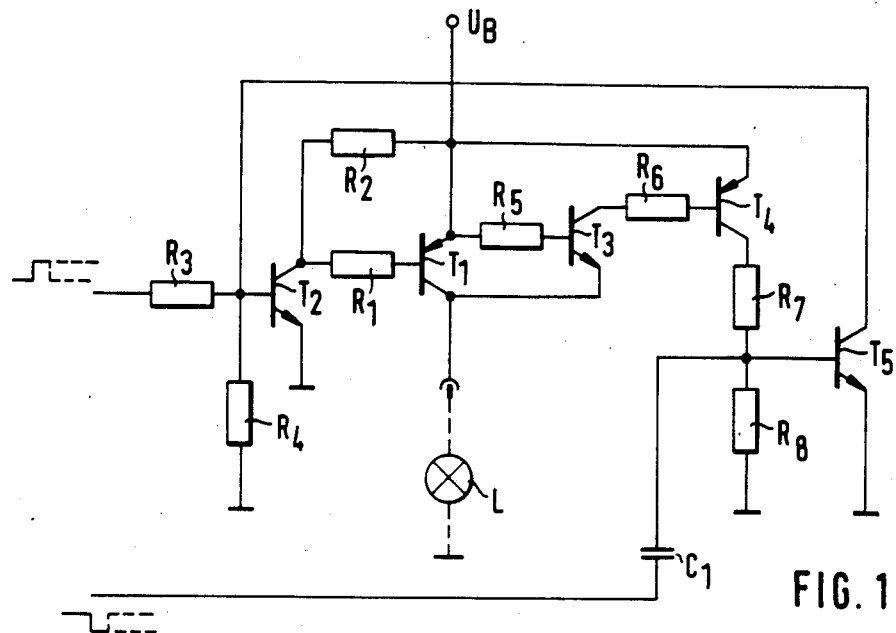
FIG. 1 shows a detailed circuit diagram of the short circuit and overload protection circuit for output stage transistors.

A short circuit and overload protection circuit for output stage transistors may be realized in accordance with the detailed circuit diagram in FIG. 1.

The drive signal is present at the voltage divider consisting of the two resistors $R_3$ and $R_4$. Connected to its tap, the junction point of $R_3$ and $R_4$, is the base electrode of the npn driving transistor $T_2$, whose emitter is connected to ground potential. Located in its collector circuit is the load resistor $R_2$ which is connected with its other end to the positive pole of the supply voltage source $U_B$. The collector of the transistor $T_2$ is connected via the resistor $R_1$ to the base of the pnp output stage transistor $T_1$, whose emitter is connected to the positive pole of the supply voltage source $U_B$. Located in its collector circuit is the load L to be driven, which is connected at its other end to ground potential. A connection extends from the emitter of the output stage transistor $T_1$ via the resistor $R_5$ to the base of the npn switching transistor $T_3$, whose emitter is directly connected to the collector of the output stage transistor $T_1$ and whose collector leads to a resistor $R_6$, whose other end is connected to the base of a pnp switching transistor $T_4$.

The emitter of the pnp switching transistor $T_4$ is directly connected to the positive pole of the supply voltage source, and its collector leads to a voltage divider consisting of the two resistors $R_7$ and $R_8$, with the other end of the resistor $R_8$ being connected to ground potential. Connected at the tap of the voltage divider $R_7$–$R_9$ is the base of the protective transistor $T_5$, whose emitter is connected to ground potential and whose collector is directly connected to the base of the driving transistor $T_2$. Also connected to this tap is a capacitor $C_1$.

The pnp output stage transistor $T_1$ is to be protected when the load L located in its collector branch is short-circuited or, for example, acquires low resistance through leakage currents. The driving transistor $T_2$ for the output stage transistor $T_1$ is made conductive by a high signal at $R_3$, and $T_1$ is therefore also switched through and current may flow via the load L.

In the absence of a short circuit or an overload, the emitter collector voltage $U_{EC}$ of the output stage transistor $T_1$ is smaller than the voltage required to drive the npn switching transistor $T_3$ with the result that the protection circuit is not activated.

The occurrence of an overload causes the collector current $I_C$ of the output stage transistor $T_1$ to rise, which also involves an increase in the emitter collector voltage $U_{EC}$ of $T_1$. When it exceeds in amount the base emitter voltage $U_{BE}$ of the npn switching transistor $T_3$ of approximately 0.7 V, the transistor $T_3$ is switched through, whereby the pnp switching transistor $T_4$ is also switched through and the protective transistor $T_5$ is driven.

The collector emitter voltage of the protective transistor $T_5$ draws the base of the driving transistor $T_2$ t almost ground potential, whereby the latter is blocked, which results in the output stage transistor $T_1$ likewise being blocked and, therefore, protected from thermal destruction.

During the switching-on procedure, when the supply voltage source $U_B$ is switched on, and a high signal is present at the base resistor $R_3$ of the driving transistor $T_2$, the output stage transistor $T_1$—has on account of running time delays —not yet switched through at the switching-on moment, so that its emitter collector voltage $U_{CE(T_1)}$ equals the supply voltage $U_B$ and therefore exceeds the switching threshold of the base emitter voltage $U_{EB}$ of $T_3$. The above-described case would then occur, which is undesirable, in that the output stage transistor $T_1$ would remain blocked, and no load current could flow through the load L.

In order to actually switch the output stage transistor $T_1$ through during the switching-on procedure of the supply voltage source $U_B$ and when the output stage transistor $T_1$ is driven, i.e., when a high signal is present at the base resistor $R_3$, there is provided the capacitor $C_1$ whose drive connection is drawn by the complementary input switching signal to almost ground potential, and which together with the resistor $R_7$ forms a low-pass RC member and effects a time delay for the switching-through of the protective transistor $T_5$.

This time delay must be longer than the delay time of the switching-on procedure of the output stage transistor $T_1$ caused by running times. In this way, the protection circuit is put into a defined initial state. When the output stage transistor $T_1$ is switched through, its emitter collector voltage is lower than the voltage required to switch through the npn switching transistor $T_3$, and the protective transistor $T_5$ remaining blocked can, therefore, not influence the driving of the output stage transistor.

During the switching-on procedure of the supply voltage source $U_B$, and in the blocked state of the output stage transistor, when a low signal is present at the base ressitor $R_3$, the emitter collector voltage of the output stage transistor equals the supply voltage $U_B$ so that the npn switching transistor $T_3$, the pnp switching transistor $T_4$ and the protective transistor $T_5$ are switched through, whereby the base of the driving transistor $T_2$ is drawn to almost ground potential via the collector emitter path of the protective transistor $T_5$.

If the drive signal at resistor $R_3$ changed from low to high without the complementary driving of the capacitor $C_1$, with a change from high to low, the output stage transistor $T_1$ would not switch through, since the high signal now present at resistor $R_3$ would be drawn via the collector emitter path of the protective transistor $T_5$ at the base of transistor $T_2$ to almost ground potential, which would result in the output stage transistor $T_1$ remaining blocked the whole time.

By the complementary driving of the capacitor $C_1$, the latter, when a low signal is initially at resistor $R_3$, is charged via a pull-up-resistor, not illustrated, to a defined voltage. Its other connection is connected to the tap of the voltage divider $R_7$, $R_8$ and avails of approximately 0.7 V, since the pnp switching transistor $T_4$ is switched through in this case, and the base of transistor $T_5$ is driven via the resistor $R_7$. If the input switching signal at resistor $R_3$ now changes from low to high, the signal at capacitor $C_1$ changes from high to low, and the capacitor $C_1$ is discharged via the resistor $R_8$, which together with the capacitor $C_1$ forms a differentiating high-pass RC member. Present at the moment of the level switch-over at resistor $R_3$ from low to high at the base emitter path of the protective transistor $T_5$ is therefore a negative needle-pulse-shaped voltage whose decay constant results from the value of capacitor $C_1$ and the resistor $R_8$. The protective transistor $T_5$ is thereby blocked and its collector releases the base of the driving transistor $T_2$ so that the output stage transistor $T_1$ is switched through and current may flow via the load L. The driving of transistor $T_5$ via transistors $T_3$ and $T_4$ is thereby prevented. By changing the base current of transistor $T_1$, i.e., by changing resistor $R_1$, the response threshold of the protection circuit may be varied in a large range.

In a suitable embodiment, the dimensioning of the RC members consisting of the capacitor $C_1$ and the resistors $R_7$ and $R_8$ is to be selected as follows:

$C_1 = 1\ \mu F$ $R_7 = 200\ k$ $R_8 = 100\ k$

Figure 2:
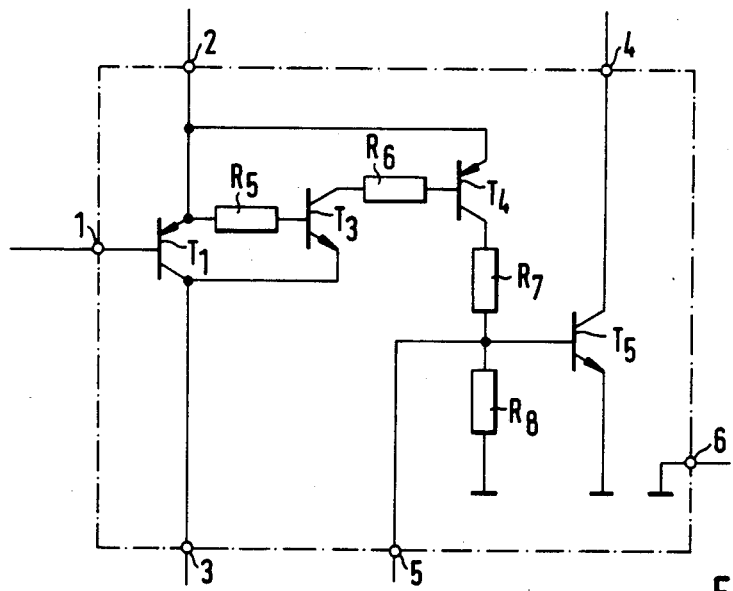
FIG. 2 shows an output stage transistor with a short circuit and overload protection circuit, designed as integrated circuit or as hybrid.

FIG. 2 shows a protection circuit integrated with the output stage transistor $T_1$. The base of the output stage transistor $T_1$ is conducted out to the pin 1 and is connected there via the resistor $R_1$ to the collector of the driving transistor $T_2$. The collector of the output stage transistor $T_1$ is conducted out to the pin 3 where the load L to be driven is connected. Its emitter is connected to pin 2 where the supply voltage source is connected. In the integrated circuit, a connection leads from the emitter of the output stage transistor $T_1$ via the resistor $R_5$ to the base of the npn switching transistor $T_3$, whose emitter is connected to the collector of transistor $T_1$. The collector of transistor $T_3$ leads via the resistor $R_6$ to the base of the pnp switching transistor $T_4$ whose emitter is connected to the emitter of the output stage transistor $T_1$. The collector of transistor $T_4$ leads to the voltage divider $R_7$, $R_8$, at whose tap the base of the protective transistor $T_5$ is connected. Its collector is conducted out to pin 4 where the base of the driving transistor $T_2$ is connected. The emitter of transistor $T_5$ and the other end of the voltage divider resistor $R_8$ are directly connected and lead to ground potential, whose connection is conducted out to pin 6. The tap of the voltage divider $R_7$, $R_8$ is conducted out to pin 5 where the capacitor $C_1$ is connected.

What is claimed is:

1. Short circuit and overload protection circuit for an output stage transistor which is connected to the output of a driving transistor for the output stage transistor, wherein a limitation and threshold value network means is provided for detecting the emitter collector voltage of the output stage transistor to be protected and for supplying a control voltage derived from the detected said emitter collector voltage to the base of a protective transistor, wherein the collector of this protective transistor is connected to the base of the driving transistor of the output stage transistor and the emitter of this protective transistor is connected to ground potential, and wherein the limitation and threshold value network means contains: a resistor which is located between the emitter of the output stage transistor and the base of a first switching transistor which is complementary with the output stage transistor and whose emitter is directly connected to the collector of the output stage transistor, and a further resistor which is connected between the collector of the first switching transistor and the base of a second switching transistor which is complementary with the first switching transistor, whose emitter is connected to a pole of the supply voltage source, and whose collector is connected to a voltage divider.

2. A short circuit and overload protection circuit according to claim 1 wherein the collector of said second switching transistor is connected to one end of said voltage divider whose other end is connected to ground potential.

3. Short circuit and overload protection circuit according to claim 1, wherein the output stage transistor and the second switching transistor are pnp transistors, while the first switching transistor, the protective transistor and the driving transistor are npn transistors.

4. Short circuit and overload protection circuit according to claim 1, wherein the base of the protective transistor, which is complementary with the output stage transistor, is connected to the tap of the voltage divider.

5. Short circuit and overload protection circuit according to claim 1, wherein a capacitor is connected to the tap of the voltage divider.

6. Short circuit and overload protection circuit according to claim 5, wherein a signal complementary with the input switching signal fed to the base of the driving transistor is fed to the other connection of the capacitor.

7. Short circuit and overload protection circuit according to claim 1 wherein the load to be driven is located between the collector of the output stage transistor and ground potential.

8. Short circuit and overload protection circuit according to claim 1 wherein a resistor is connected between the base of the output stage transistor and the collector of the driving transistor.

9. Short circuit and overload protection circuit according to claim 8, wherein the response threshold of the protection circuit is set by the base resistor of the output stage transistor.

10. Short circuit and overload protection circuit according to claim 1, wherein a load resistor is located between the collector of the driving transistor and the positive pole of the supply voltage source.

11. Short circuit and overload protection circuit according to claim 1, wherein the base electrode of the driving transistor is connected to the tap of a further voltage divider, and wherein its emitter is connected to ground potential.

12. Short circuit and overload protection circuit according to claim 11, wherein the input timing signal is fed to the base electrode of the driving transistor via a resistor of the further voltage divider.

13. Short circuit and overload protection circuit according to claim 1, characterized by use in automotive electronics.

14. A short circuit and overload protective circuit according to claim 1 wherein: the protective transistor and the driving transistor are complementary to the output stage transistor to be protected; and the base of the protective transistor is connected to the tap of the voltage divider.

15. A short circuit and overload protection circuit according to claim 14 further comprising: a capacitor having one terminal connected to said tap of said voltage divider; and means for feeding a signal complementary to the input switching signal fed to the base of the driving transistor to the other terminal of the capacitor during switching on of the supply voltage source for the output stage transistor.

16. A short circuit and overload protection circuit according to claim 15 wherein: the load to be driven is connected between the collector of the output stage transistor and ground; and another resistor is connected between the base of the output stage transistor and the collector of the driving transistor.

17. A short circuit and overload protection circuit according to claim 16 wherein: a load resistor is connected between the collector of the driving transistor and the positive pole of the supply voltage source; the base electrode of the driving transistor is connected to the tap of a further voltage divider having one end connected to ground potential and its other end connected to an input terminal for the switching signal fed to the base of the driving transistor.

18. A short circuit and overload protection circuit according to claim 17 wherein said output stage transistor is a pnp transistor.

* * * * *